US009524866B2

United States Patent
Chew

(10) Patent No.: US 9,524,866 B2
(45) Date of Patent: Dec. 20, 2016

(54) METHOD FOR MAKING SEMICONDUCTOR DEVICES INCLUDING REACTANT TREATMENT OF RESIDUAL SURFACE PORTION

(71) Applicant: STMICROELECTRONICS PTE LTD, Singapore (SG)

(72) Inventor: Chong Jieh Chew, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/957,141

(22) Filed: Dec. 2, 2015

(65) Prior Publication Data

US 2016/0093490 A1 Mar. 31, 2016

Related U.S. Application Data

(62) Division of application No. 14/151,188, filed on Jan. 9, 2014.

(51) Int. Cl.
| | |
|---|---|
| *H01L 21/76* | (2006.01) |
| *H01L 21/02* | (2006.01) |
| *H01L 21/033* | (2006.01) |
| *H01L 21/311* | (2006.01) |

(52) U.S. Cl.
CPC ..... *H01L 21/02252* (2013.01); *H01L 21/0234* (2013.01); *H01L 21/02129* (2013.01); *H01L 21/02274* (2013.01); *H01L 21/02321* (2013.01); *H01L 21/02334* (2013.01); *H01L 21/033* (2013.01); *H01L 21/31144* (2013.01)

(58) Field of Classification Search
CPC ............ H01L 31/022425; H01L 21/76801; H01L 21/76829
See application file for complete search history.

(56) References Cited

U.S. PATENT DOCUMENTS

| | | |
|---|---|---|
| 4,443,489 A | 4/1984 | Cowher et al. |
| 4,521,448 A | 6/1985 | Sasaki |
| 4,751,191 A * | 6/1988 | Gonsiorawski ..... H01L 21/3185 136/256 |
| 5,726,102 A * | 3/1998 | Lo ................. H01L 21/0275 257/E21.028 |
| 5,960,317 A | 9/1999 | Jeong |
| 6,097,079 A | 8/2000 | Hossain et al. |
| 7,144,606 B2 | 12/2006 | Huang |

(Continued)

OTHER PUBLICATIONS

Comizzoli "Bulk and Surface Coduction in CVD SiO2 and PSG Passivation Layers" Journal of the Electrochemical Society; Jes. Ecsdl.org/CONTENT/123/3/386 Jun. 19, 1975 Abstract Only See Priority U.S. Appl. No. 14/151,181, filed Jan. 9, 2014.

*Primary Examiner* — Zandra Smith
*Assistant Examiner* — Andre' C Stevenson
(74) *Attorney, Agent, or Firm* — Allen, Dyer, Doppelt, Milbrath & Gilchrist, P.A.

(57) ABSTRACT

A method for making semiconductor devices may include forming a phosphosilicate glass (PSG) layer on a semiconductor wafer, with the PSG layer having a phosphine residual surface portion. The method may further include exposing the phosphine residual surface portion to a reactant plasma to integrate at least some of the phosphine residual surface portion into the PSG layer. The method may additionally include forming a mask layer on the PSG layer after the exposing.

18 Claims, 3 Drawing Sheets

(56) References Cited

U.S. PATENT DOCUMENTS

| | | |
|---|---|---|
| 7,316,973 B2 | 1/2008 | Roh |
| 8,809,161 B2 * | 8/2014 | Gauri ................... C23C 16/045 |
| | | 257/E21.489 |
| 8,945,962 B2 | 2/2015 | Yamazaki et al. |
| 2004/0102005 A1 | 5/2004 | Dong et al. |
| 2013/0344702 A1 * | 12/2013 | Nishizuka ......... H01L 21/31116 |
| | | 438/724 |

* cited by examiner

| | (1) | (2) | (3) | (4) | (5) |
|---|---|---|---|---|---|
| STEP NAME | STABLE GAS | DEPOSITION | N2O FLOW | LIFT | PUMP |
| CHAMBER SELECTION | A, B OR D ONLY | A, B OR D ONLY | A, B OR D | A, B OR D | A, B OR D |
| STEP END ctrl | BY TIME | BY TIME | BY TIME | BY TIME | BY TIME |
| Max. STEP TIME * | 15.0 sec | XX.X sec | 5.0 sec | 5.0 sec | 10.0 sec |
| END POINT SELECT | NO ENDPOINT | NO ENDPOINT | NO ENDPOINT | NO ENDPOINT | NO ENDPOINT |
| PRESSURE ** | SERVO 4.0 Torr | SERVO 4.0 Torr | SERVO 4.0 Torr | THROTTLE FULLY OPEN | THROTTLE FULLY OPEN |
| PRESSURE RAMP RATE | 0 Torr/sec | 0 Torr/sec | 0 Torr/sec | 0 Torr/sec | 0 Torr/sec |
| RF pwr, MATCH, MODE *** | 0 W, AUTO, B-TO-B | 300 W, AUTO, B-TO-B | 250 W, AUTO, B-TO-B | 75 W, AUTO, B-TO-B | 0 W, AUTO, B-TO-B |
| RF TUNE SETPOINT ** | 0.0 V | 0.0 V | 0.0 V | 0.0 V | 0.0 V |
| RF POWER, MATCH | 0 W, AUTO | 0 W, AUTO | 0 W, AUTO | 0 W, AUTO | 0 W, AUTO |
| DPA RF | OFF | OFF | OFF | OFF | OFF |
| Susc. TEMPERATURE | 400 C | 400 C | 400 C | 400 C | 400 C |
| TEMPERATURE RAMP | 0.0 C/sec | 0.0 C/sec | 0.0 C/sec | 0.0 C/sec | 0.0 C/sec |
| PURGE FLOW | OFF | OFF | OFF | OFF | OFF |
| SUSCEPTOR SPACING ** | 250 mils | 250 mils | 250 mils | 850 mils | 850 mils |
| CHAMBER BYPASS | OFF | OFF | OFF | OFF | OFF |
| GAS NAME AND FLOWS *** | N2O 1100 scc | N2O 1100 scc | N2O 1100 scc | N2O 1100 scc | N2O -1 PU |
| | SIH4 65 scc | SIH4 65 scc | | | |
| | PH3 450 scc | PH3 450 scc | | | |

FIG. 3

METHOD FOR MAKING SEMICONDUCTOR DEVICES INCLUDING REACTANT TREATMENT OF RESIDUAL SURFACE PORTION

FIELD OF THE INVENTION

The present invention relates to the field of electronic devices and, more particularly, to semiconductor devices and related methods.

BACKGROUND OF THE INVENTION

Cleaning is performed during semiconductor processing to remove surface particles, contaminants, native or chemical oxides, etc. Wafer cleaning and surface preparation steps may be required throughout the fabrication process, and inadequate cleaning may result in significant losses in device yield.

Various approaches for semiconductor wafer cleaning may be used. One approach involves wet chemical cleaning, in which a chemical is applied to react with a contaminant and remove it from the wafer surface. Another approach involves a jet scrubber, which sprays very fine droplets of water or chemicals at a high velocity onto a wafer surface to scrub contaminants or other particles away from the surface of the wafer.

Despite the existence of such approaches, further enhancements in wafer cleaning may be desirable, such as for next generation devices with relatively small dimensions.

SUMMARY OF THE INVENTION

A method for making semiconductor devices may include forming a phosphosilicate glass (PSG) layer on a semiconductor wafer, with the PSG layer having a phosphine residual surface portion. The method may further include exposing the phosphine residual surface portion to a reactant plasma to integrate at least some of the phosphine residual surface portion into the PSG layer. The method may additionally include forming a mask layer on the PSG layer after the exposing.

More particularly, the reactant plasma may comprise oxygen. Furthermore, forming of the mask layer may be performed after the exposing without an intervening scrubbing operation. Forming the PSG layer may comprise a deposition at a first radio frequency (RF) power, and exposing the phosphine residual surface portion to the reactant plasma may be performed at a second RF power less than the first RF power.

In addition, forming the PSG layer and exposing the phosphine residual surface portion may be performed in an RF plasma chamber. By way of example, exposing of the phosphine residual surface portion may be performed at a pressure in a range of 3 to 5 Torr. Also by way of example, exposing of the phosphine residual surface portion may be performed at a temperature in a range of 300 to 500° C. Additionally, forming the dielectric layer and exposing the phosphine residual surface portion may be performed with an $N_2O$ flow rate in a range of 1000-1200 scc, for example.

BRIEF DESCRIPTION OF THE DRAWINGS

FIG. 3 is a table illustrating example processing parameters for an implementation of the method of FIG. 2.

DETAILED DESCRIPTION OF THE EMBODIMENTS

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
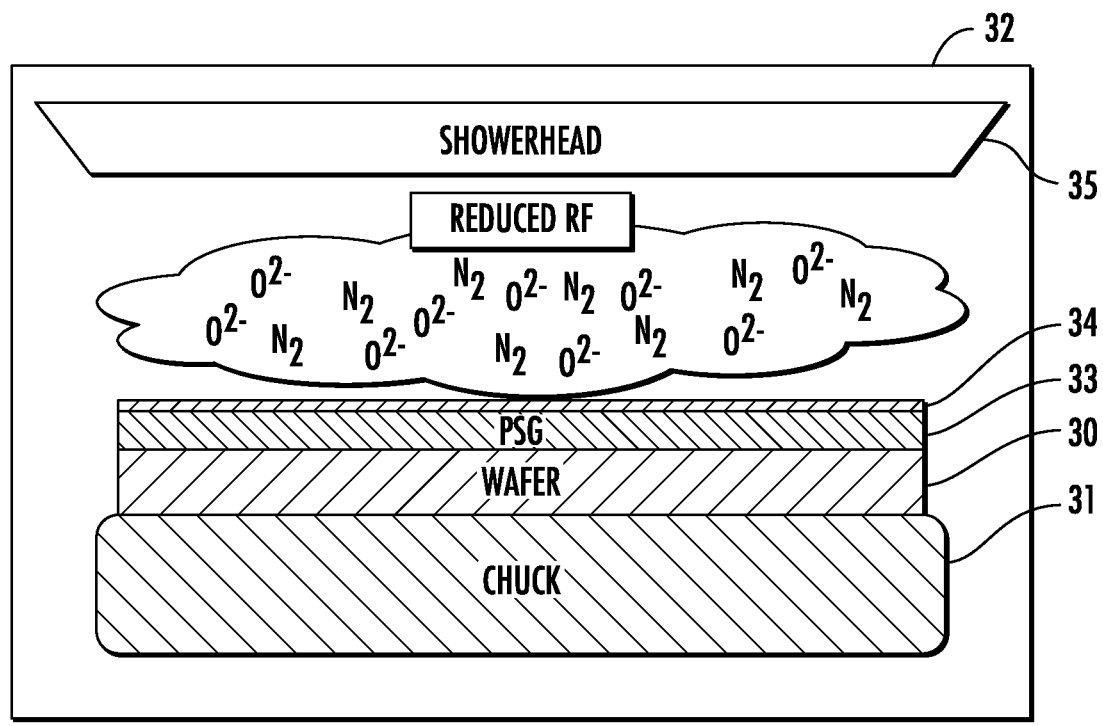
FIG. 1 is a schematic block diagram illustrating a semiconductor processing step for removing a phosphine residual surface portion from a phosphosilicate glass (PSG) layer in accordance with an example embodiment.

Referring initially to FIG. 1, during semiconductor wafer processing, a wafer 30 (e.g., silicon, silicon-germanium, etc.) may be held by a chuck 31 within a processing chamber 32 (e.g., a radio frequency (RF) plasma chamber). In the illustrated example, a phosphosilicate glass (PSG) insulating layer 33 is formed on the underlying wafer 30. By way of example, dielectric insulating layers such as PSG (including borophosphosilicate glass or BPSG) may be deposited between metal or conducting layers in semiconductor devices. However, when depositing certain dielectric layers, a residual surface portion(s) or layer 34 may be left which requires removal or cleaning before subsequent steps may be adequately performed. For example, in the case of PSG deposition, phosphine gas (which is introduced into the processing chamber 32 via a showerhead 35) may be adsorbed on the upper surface of the PSG layer 33 leaving the phosphine residual layer 34. Yet, the residual layer 34 may prove problematic in subsequent steps, such as a masking step, if not removed. That is, the masking material may be subject to "popping" or peeling off the PSG layer 33 as a result of the residual layer 34. Applicant theorizes, without wishing to be bound thereto, that this is because the surface contamination prevents proper photoresist adhesion on the PSG layer 33.

As a result, it may therefore be desirable to remove the residual layer 34 prior to proceeding with subsequent processing steps (e.g., mask layer deposition for layer patterning, etc). This would typically be done using a physical method such as a jet scrubber or chemical cleaning, as discussed above. However, both of these approaches may have certain drawbacks in the semiconductor fabrication process. For example, while a jet scrubber will lower the hit rate of the residual layer 34, it typically will not remove all of the residual layer. Furthermore, both of these approaches may involve extra steps/cycle time, and therefore increased costs associated with the fabrication process.

Figure 2:
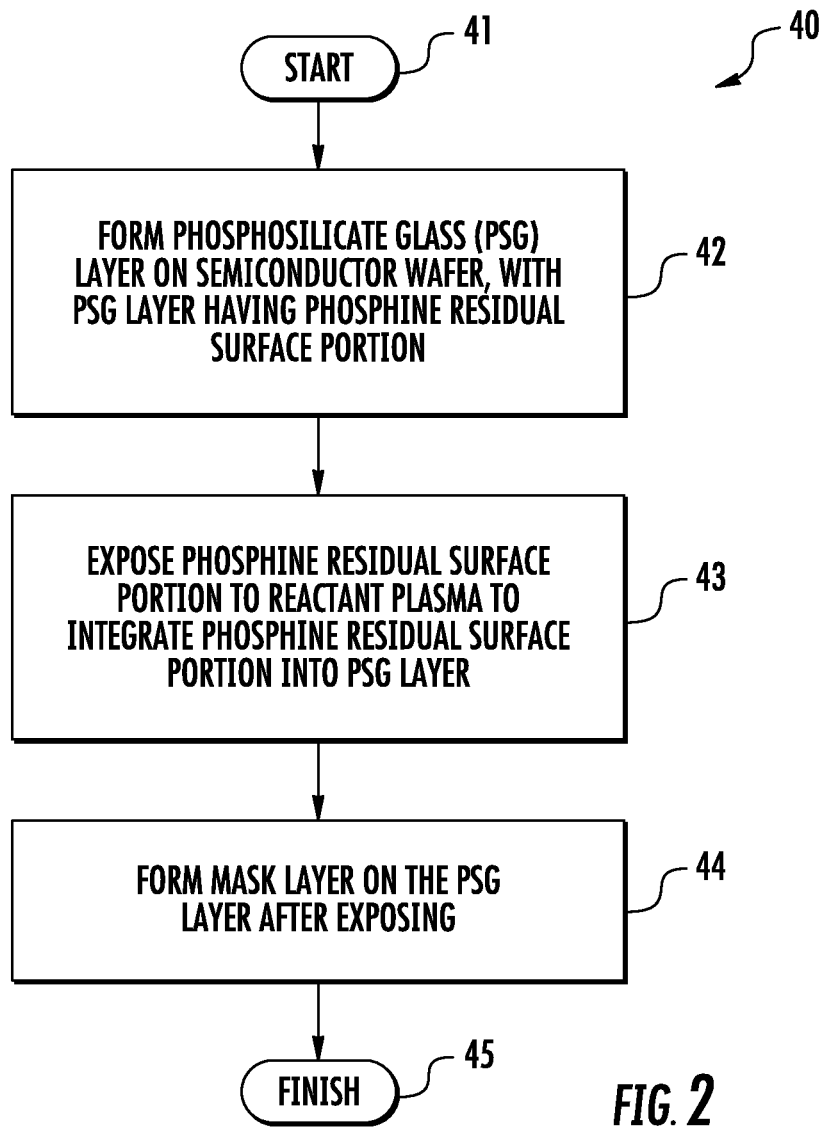
FIG. 2 is a flow diagram illustrating a method for making a semiconductor device including the phosphine residual surface portion removal step shown in FIG. 1.

Referring additionally to the flow diagram 40 of FIG. 2, in accordance with an example embodiment, another approach for removing the residual layer 34 is now described. Beginning at Block 41, upon formation of the PSG layer 33 on the semiconductor wafer 30 (and, consequently, the residual layer 34), the phosphine residual surface portion(s) may be exposed to a reactant plasma to integrate the phosphine residual surface portion into the PSG layer, at Block 43.

More particularly, a gas flow (e.g., an oxygen-based gas flow, such as $N_2O$) may be introduced via the showerhead 35 along with RF energy to provide the reactant plasma. Generally speaking, the PSG layer 33 may involve a deposition at a first RF power (e.g. 300 w, while the exposure of the phosphine residual surface portion to the reactant plasma may be performed at a second RF power (e.g. 250 w) less than the first RF power. That is, the reactant plasma exposure may advantageously be performed at a reduced power level with respect to the PSG layer 33 deposition.

The Applicant theorizes that the $N_2O$ will fully react with the residual phosphine complex of the residual layer 34 and integrate it into the PSG layer 33. This will not only provide a purging effect, but also removal of the residual phosphine gases. The unreacted gases are accordingly adsorbed into the surface of the wafer 30 to remove this contamination from PSG layer 33, which would otherwise prevent proper adhesion of a masking or photoresist layer subsequently on the PSG layer, for example, at Block 44. The method of FIG. 2 concludes at Block 45. Those of skill in the art will recognize that other steps may be performed both before and after the noted steps to form semiconductor devices, such as integrated circuits, for example.

The above-described approach may advantageously allow for the removal of the jet scrubber or chemical clean after passivation PSG deposition, while providing for little or no mask popping issues. That is, formation of the mask layer may be performed after the reactant plasma exposure without an intervening jet or chemical scrubbing operation. As a result, this may provide a significant savings in terms of wafer cost and cycle time.

Referring more particularly to the chart 50 of FIG. 3, example processing flow parameters are provided for an implementation of the above-described approach, which includes the introduction of a stable gas (1), PSG deposition (2), the $N_2O$ plasma clean (3), lifting (4) and pumping (5), as shown. Of course, it will be appreciated that subsequent device processing steps (including additional PSG or dielectric depositions and residual layer removal) may be performed to provide additional layers or regions depending upon the given semiconductor device to be fabricated.

In the illustrated example, exposing of the phosphine residual surface portion(s) 34 may be performed at a pressure in a range of 3 to 5 Torr, and more specifically about 4 Torr. Also by way of example, exposing of the phosphine residual surface portion(s) 34 may be performed at a temperature in a range of 300 to 500° C., and more particularly about 400° C. The PSG layer 33 deposition and exposure of the phosphine residual surface portion(s) 34 may be performed with an $N_2O$ flow rate in a range of 1000-1200 sec, and more particularly 1100 sec, for example. Other exemplary processing parameters are shown in the chart 50, although it will be appreciated that different parameters may be used in different embodiments.

Using the example approach shown in FIG. 3, a semiconductor wafer fabrication test run was performed. As compared with a similar approach which utilized a jet scrubber, use of the reactant plasma removal instead of the jet scrubber shortened the total product cycle time by approximately two hours per lot. Over a 40-week implementation period with approximately 5000 lots processed, a total of approximately 10,000 lot hours were saved. This is due in part to no longer needing to transport the wafer 30 to a jet scrubber station after deposition of the PSG layer 33. In terms of cost savings, it is estimated the savings from the above-described approach are approximately $0.60 (USD) per wafer, resulting in about $80,000 in total savings cost for the 40-week implementation.

The test run resulted in no noticeable occurrences of popping. Moreover, the example approach utilizes existing materials and may be performed in the same chamber 32 in which the PSG layer 33 deposition occurs. It was also determined that there was a negligible impact on existing inline qualification parameters.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making semiconductor devices comprising:
   forming a dielectric layer on a semiconductor wafer within a chamber, the dielectric layer having a residual surface contamination portion on a top surface of the dielectric layer opposite the semiconductor wafer;
   exposing the residual surface contamination portion to a reactant plasma to integrate at least some of the residual surface contamination portion from the top surface into the dielectric layer and without removing the semiconductor wafer from the chamber; and
   forming a mask layer on the dielectric layer after the exposing and without subjecting the dielectric layer to an intervening chemical cleaning operation and without removing the semiconductor wafer from the chamber.

2. The method according to claim 1 wherein the reactant plasma comprises oxygen.

3. The method according to claim 1 wherein forming the dielectric layer comprises deposition at a first radio frequency (RF) power; and wherein exposing the residual surface portion to the reactant plasma is at a second RF power less than the first RF power.

4. The method according to claim 1 wherein the chamber comprises a radio frequency (RF) plasma chamber.

5. The method according to claim 1 wherein exposing of the residual surface portion is performed at a pressure in a range of 3 to 5 Torr.

6. The method according to claim 1 wherein forming the dielectric layer and exposing the residual surface portion are performed at a temperature in a range of 300 to 500° C.

7. The method according to claim 1 wherein forming the dielectric layer and exposing the residual surface portion are performed with an $N_2O$ flow rate in a range of 1000-1200 sec.

8. A method for making semiconductor devices comprising:
   forming a dielectric layer on a semiconductor wafer within a plasma processing chamber, the dielectric layer having a residual surface contamination portion on a top surface of the dielectric layer opposite the semiconductor wafer;
   exposing the residual surface contamination portion to a reactant plasma to integrate at least some of the residual surface contamination portion from the top surface into the dielectric layer and without removing the semiconductor wafer from the plasma processing chamber; and
   forming a mask layer on the dielectric layer after the exposing and without subjecting the dielectric layer to an intervening chemical cleaning and without removing the semiconductor wafer from the plasma processing chamber.

9. The method according to claim 8 wherein the reactant plasma comprises oxygen.

10. The method according to claim 8 wherein forming the dielectric layer comprises deposition at a first power; and wherein exposing the residual surface portion to the reactant plasma is at a second power less than the first power.

11. The method according to claim 8 wherein exposing of the residual surface portion is performed at a pressure in a range of 3 to 5 Torr.

12. The method according to claim 8 wherein forming the dielectric layer and exposing the residual surface portion are performed at a temperature in a range of 300 to 500° C.

13. The method according to claim 8 wherein forming the dielectric layer and exposing the residual surface portion are performed with an $N_2O$ flow rate in a range of 1000-1200 sccm.

14. A method for making semiconductor devices comprising:
  forming a dielectric layer on a semiconductor wafer within a plasma processing chamber, the dielectric layer having a residual surface contamination portion on a top surface of the dielectric layer opposite the semiconductor wafer;
  exposing the residual surface contamination portion to a reactant oxygen plasma to integrate at least some of the residual surface contamination portion from the top surface into the dielectric layer and without removing the semiconductor wafer from the plasma processing chamber; and
  forming a mask layer on the dielectric layer after the exposing and without subjecting the dielectric layer to an intervening chemical cleaning and without removing the semiconductor wafer from the plasma processing chamber.

15. The method according to claim 14 wherein forming the dielectric layer comprises deposition at a first power; and wherein exposing the residual surface portion to the reactant plasma is at a second power less than the first power.

16. The method according to claim 14 wherein exposing of the residual surface portion is performed at a pressure in a range of 3 to 5 Torr.

17. The method according to claim 14 wherein forming the dielectric layer and exposing the residual surface portion are performed at a temperature in a range of 300 to 500° C.

18. The method according to claim 14 wherein forming the dielectric layer and exposing the residual surface portion are performed with an $N_2O$ flow rate in a range of 1000-1200 sccm.

* * * * *